(12) United States Patent
Yamada (10) Patent No.: US 6,605,867 B2
(45) Date of Patent: Aug. 12, 2003

(54) SURFACE MOUNT TYPE SEMICONDUCTOR PACKAGE AND MANUFACTURING METHOD THEREFOR

(75) Inventor: Shigeru Yamada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/989,382

(22) Filed: Nov. 21, 2001

(65) Prior Publication Data

US 2003/0011063 A1 Jan. 16, 2003

(30) Foreign Application Priority Data

Jul. 16, 2001 (JP) .......................................... 2001-214612

(51) Int. Cl.[7] ............................................... H01L 29/72
(52) U.S. Cl. ........................ 257/698; 257/690; 257/700
(58) Field of Search ................................. 257/698, 690, 257/700

(56) References Cited

U.S. PATENT DOCUMENTS

2001/0023983 A1 * 9/2001 Kobayashi et al. ......... 257/698

FOREIGN PATENT DOCUMENTS

| JP | 10-163406 | 6/1998 |
|----|-----------|--------|
| JP | 2000-077558 | 3/2000 |

* cited by examiner

Primary Examiner—Edward Wojciechowicz
(74) Attorney, Agent, or Firm—Rabin & Berdo, P.C.

(57) ABSTRACT

A conductive layer is formed on a dielectric substrate on which a semiconductor chip is mounted, and holes are formed passing through the layer and the substrate. After this, before the through-holes are filled with a conductive material, the conductive layer is patterned by patterning. By patterning, conductive patterns are formed from the conductive layer. After the conductive patterns are formed, the through-holes are filled with a conductive material while both ends of the holes are open, to form conductors. In the above process, one open end of each through-hole is used as a leak hole to discharge air bubbles, thus suppressing the occurrence of voids caused by bubbles, and an increase in electrical resistance in the conductors by voids can be prevented.

11 Claims, 5 Drawing Sheets

SURFACE MOUNT TYPE SEMICONDUCTOR PACKAGE AND MANUFACTURING METHOD THEREFOR

FIELD OF THE INVENTION

The present invention relates to a surface mount type semiconductor package and a manufacturing method of this semiconductor package.

RELATED ART

A column grid array semiconductor package and a manufacturing method of the same are disclosed in Japanese Patent Laid-Open Publication No. Hei 10-163406.

In a semiconductor package set forth in the above publication, a semiconductor chip having connection terminals is mounted on one surface of a dielectric substrate and the connection terminals of the semiconductor chip are connected through bonding wires to conductive patterns formed on the one surface of the dielectric substrate. The conductive patterns are connected to conductors passing through the dielectric substrate, and the conductors are exposed on the other surface of the dielectric substrate so as to be connectable to a mother board. The semiconductor chip and the conductive patterns are encapsulated by a resin on the dielectric substrate.

According to a method for manufacturing a semiconductor package disclosed in the above-mentioned publication, on the dielectric substrate with a semiconductor chip mounted on it, a conductive layer to form the conductive patterns on one surface of the substrate is formed all over the one surface of the substrate. Holes to form the conductors are formed to pass in the thickness direction in the dielectric substrate. Those through-holes extend to the conductive layer on the dielectric substrate and further pass through the conductive layer and are open to the outside.

After the holes passing through the conductive layer and the dielectric substrate have been formed, the conductive layer has its unnecessary portions removed and is covered with photoresist for use in patterning to form the conductive patterns by the remaining portions of the conductive layer.

By the formation of the photoresist layer, one-end sides of the holes passing through the dielectric substrate and the conductive layer on the substrate are closed by the photoresist layer, and under this condition, a plating process is carried out to fill up the through-holes.

By this plating process, the conductors to fill up the holes are formed, and then the photoresist layer is subjected to patterning by the exposure and development steps, and conductive patterns are formed by selective etching of the conductive layer with the patterned photoresist used as an etching mask.

However, the formation of the conductors is performed before patterning of the photoresist, in other words, before the conductive patterns are formed; therefore, the one-end sides of the holes are closed by the photoresist in the process of forming the conductors, and when a semiconductor structure is dipped in a plating liquid and the liquid enters the open end sides of the holes, there are no leak holes for air bubbles to escape from the holes, so that voids often occur in the conductors due to the bubbles remaining in the holes.

The voids give rise to increased electric resistance or faulty connections at the conductors.

According to the above-mentioned method, the conductors are in contact with the conductive layer only on their circumferential surfaces.

For this reason, sufficient strength cannot be secured at electrical connection of the conductors with the conductive patterns formed by patterning of the conductive layer, leaving a possibility of faulty contact between them.

SUMMARY OF THE INVENTION

Therefore, an object of the present invention is to provide a surface mount type semiconductor package, which is free from increased electrical resistance due to voids that occur in the conductors, and a manufacturing method therefore.

Another object of the present invention is to provide a surface mount type semiconductor package that ensures electrical connection of the conductors with the conductive patterns.

To achieve the above objects, the present invention adopts the following configurations.

In an aspect of the present invention, a surface mount type semiconductor package comprises a semiconductor chip having a connection terminal; a dielectric substrate with the semiconductor chip mounted thereon, the dielectric substrate having on one surface with the semiconductor chip mounted thereon a conductive pattern connected to the connection terminal of the semiconductor chip and also having a hole formed passing in the thickness direction through the dielectric substrate; and a conductor located in the through-hole to fill up the through-hole, with one end connected to the conductive pattern and the other end serving as a connection end to a mother board on the other surface of the dielectric substrate, the semiconductor chip and the conductive pattern being encapsulated by a resin on the dielectric substrate, wherein the one end of the conductor is electrically connected to the conductive pattern at a circumferential surface of the conductive pattern defining the through-hole in the conductive pattern and also at an opening edge portion of the through-hole on the conductive pattern.

At one end of the conductor, a wide-diameter portion may be formed covering the opening edge portion of the upper surface of the conductive pattern and therefore the conductor is, at a circumferential surface near the wide-diameter portion of the conductor, in contact with the circumferential surface of the conductive pattern and, at a flat surface of the wide-diameter portion of the conductor, in contact with the opening edge portion.

The conductor may have a small-diameter portion passing through the conductive pattern and also have at the end of the small-diameter portion a wide-diameter portion covering the opening edge portion of the conductive pattern.

Further, the conductor may have a small-diameter portion passing through the conductive pattern and is at a flat surface of a shoulder portion defining the small-diameter portion and at the circumferential surface of the small-diameter portion electrically connected respectively to the circumferential surface of the conductive pattern and the opening edge portion on the lower surface of the conductive pattern.

In another aspect of the present invention, a surface mount type semiconductor package comprises a dielectric substrate having an upper surface and a lower surface; a first hole passing from the upper surface to the lower surface of the substrate; a conductive pattern formed on the upper surface of the substrate; a semiconductor chip mounted on the upper surface of the substrate and electrically connected to the conductive pattern; and a conductor made of a conductive material extending from the upper surface of the substrate through the first hole to the lower surface of the substrate, wherein the conductor is formed onto the conductive pattern and is formed with an external connection terminal at the other end.

When the through-hole is filled with a conductive material to form the conductor, the conductor may be formed by drawing a molten conductive material into the through-hole by a negative pressure. After the through-hole is filled with the conductive material, the conductive material is solidified, by which the conductor is formed.

The conductor may be formed by having a molten conductive material dripped into the through-hole from one end of the through-hole to fill up the through-hole by the conductive material, and the conductive material is solidified and the conductor is formed.

Instead of the example described above, the conductor may be formed by electrolytic plating or electroless plating. Also in this case, one end of the through-hole may be used as a leak hole, so that a conductor without voids can be formed.

Before the conductor is formed, a dielectric layer may be formed which selectively exposes an opening edge portion of the conductive pattern, then the conductor may be formed so as to be monolithic with a wide-diameter portion that fills up a space of the opening edge portion exposed from the dielectric layer. Thus, the conductor, which is securely connected to the conductive pattern, can be formed with relatively easily.

In an additional aspect of the present invention, a surface mount type semiconductor package comprises a dielectric substrate having an upper surface and a lower surface; a first hole passing from the upper surface of the substrate to the lower surface of the substrate; a second hole provided at a location corresponding to the first hole, and the second hole whose circumference is smaller than the that of the first hole; a conductive pattern formed on the upper surface of the substrate; a semiconductor chip mounted on the upper surface of the substrate and electrically connected to the conductive pattern; and a conductor made of a conductive material extending from the upper surface of the substrate through the first hole and the second hole to the lower surface of the substrate, wherein the conductor is formed onto the conductive pattern and is formed with an external connection terminal at the other end.

The conductive pattern may have a second hole formed at a location corresponding to the first hole, and the conductor may be formed by a conductive material extending through the first hole and the second hole.

In a still other aspect of the present invention, a surface mount type semiconductor package having a dielectric substrate with a first hole passing from an upper surface to a lower surface, a conductive pattern formed on the upper surface of the dielectric substrate, and a semiconductor chip mounted on the upper surface and electrically connected to the conductive pattern, comprises a conductor made of a conductive material extending from the upper surface through first hole to the lower surface and also onto the conductive pattern, the conductor being at one end electrically connected to the conductive pattern and at the other end formed with an external connection terminal.

The conductive pattern may have a first opening portion at a location corresponding to the through-hole, and the conductor may be formed by a conductive material extending through the through-hole and the first opening portion.

The first opening portion may be formed to have a circumference smaller than that of the through-hole.

An insulating film may be formed on the conductive pattern, a second opening portion, including a first opening portion, may be formed at a location corresponding to the first opening portion of the insulating film, and the conductor may be formed by a conductive material extending through the first and the second opening portions and the through-hole.

The upper surface of the conductive pattern may be exposed from the second opening portion, and the conductor may be formed by a conductive material extending from the upper surface of the conductive pattern through the first opening portion and the through-hole.

BRIEF DESCRIPTION OF THE DRAWINGS

The above and other objects, advantages and features of the present invention will be more apparent from the following description taken in conjunction with the accompanying drawings in which:

FIG. 2(a)–FIG. 2(f) are process steps showing a method for manufacturing the semiconductor package of the present invention;

DESCRIPTION OF EMBODIMENTS

Preferred embodiments will be described with reference to the accompanying drawings.

Embodiment 1

Figure 1:
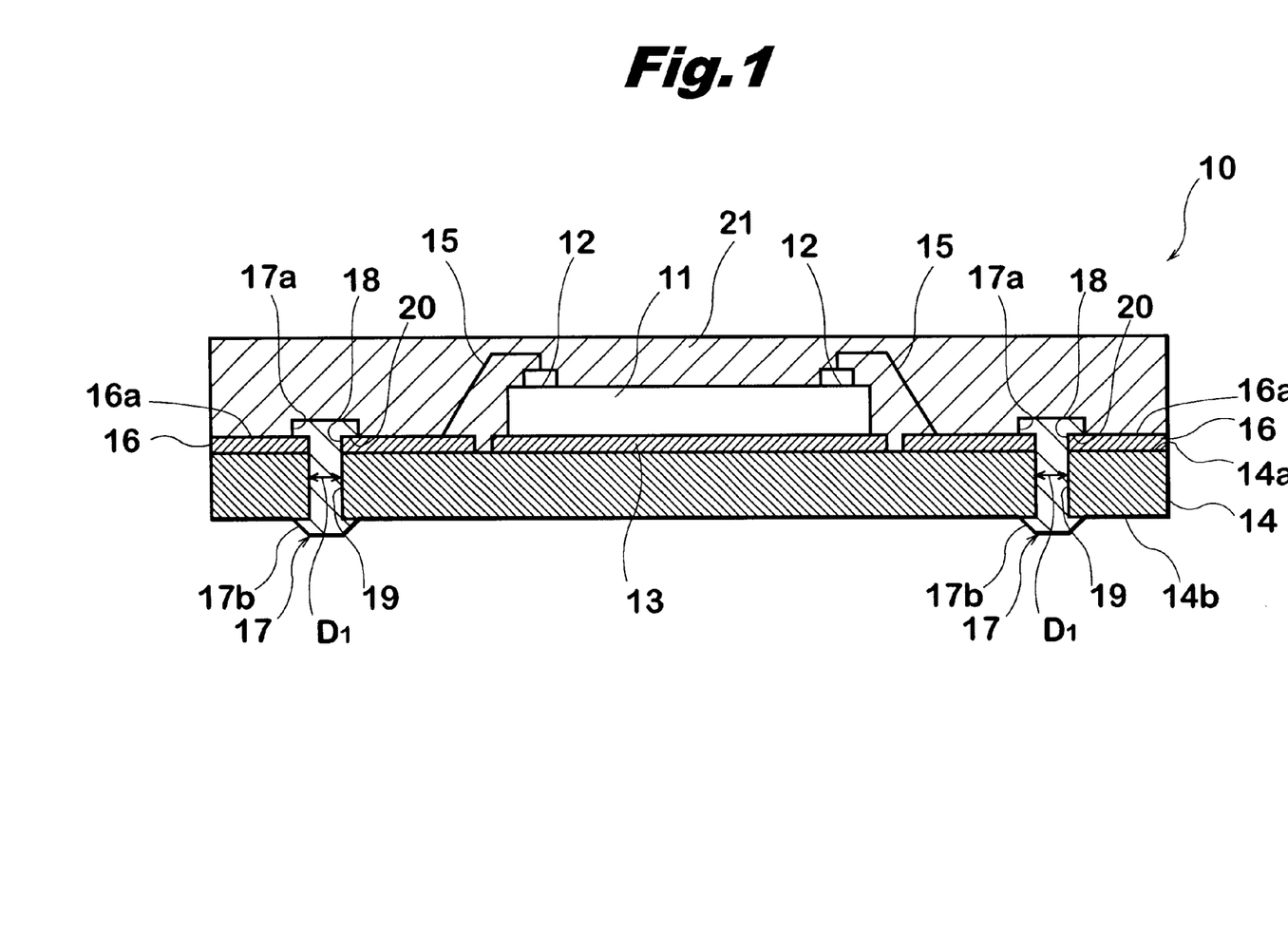
FIG. 1 is a sectional view schematically showing a first embodiment of a semiconductor package of the present invention.

FIG. 1 schematically shows a first embodiment of a surface mount type semiconductor package according to the present invention.

As shown in FIG. 1, a surface mount type semiconductor package according to the present invention includes a semiconductor chip 11 having an integrated circuit, not shown, embedded in it, and has a plurality of connection terminals for the integrated circuit mounted on the chip.

The semiconductor chip 11, as is well known, is secured to the upper surface 14a of the dielectric substrate 14 with interposition of a binding layer 13.

On the upper surface 14a of the dielectric substrate 14, conductive patterns 16 are formed, which are electrically connected through bonding wires 15 to the connection terminals 12 on the semiconductor chip 11.

The conductive patterns 16 are connected to columnar conductors 17 passing through the conductive pattern and the dielectric substrate 14.

In the conductive patterns 16 and the dielectric substrate, holes 18 and 19 with the same bore diameter are formed in the through-thickness direction at matching locations for the conductors 17. To fill up the holes 18 and 19, columnar conductors 17 are formed with diameter D1 almost equal to the above-mentioned bore diameter.

In the example shown in FIG. 1, each of the conductors 17 has as one end protruding beyond the hole 18 a first wide-diameter portion 17a covering the opening edge portion at the upper surface 16a of the conductive pattern 16, and also has at the other end protruding beyond the lower surface of the dielectric substrate 14 a second wide-diameter portion 17b serving as a connection end to a mother board external to the dielectric substrate.

The first wide-diameter portion 17a defines an annular flange surface 20 to contact the upper surface 16a of the conductive pattern 16, and is joined with the upper surface 16a of the conductive pattern 16. Therefore, the conductor 17 is, at the flange surface 20 of the wide-diameter portion 17a, electrically connected firmly to the conductive pattern 16. The conductor 17 is, at a circumferential surface near the wide-diameter portion 17a of the one end mentioned above, joined in tight contact with a circumferential surface of the conductive pattern that defines the hole 18. In other words, the conductor 17 extends through the holes 18 and 19 from the upper surface to the lower surface of the dielectric substrate and is formed by a conductive material that extends on the conductive pattern 16.

Therefore, each conductor 17 is, at the circumferential surface of the conductive pattern which defines the hole 18, electrically and mechanically coupled to the corresponding conductive pattern 16 and the flat flange surface 20 of the wide-diameter portion 17a is electrically and mechanically connected to the conductive pattern 16.

Therefore, the conductor 17 is also at the opening edge portion of the hole 18 at the upper surface 16a of the conductive pattern 16, electrically and mechanically connected to the conductive pattern 16.

The second wide-diameter portion 17b protruding beyond the lower surface 14b of the dielectric substrate 14, in the example illustrated, has a frusto-conical shape. This wide-diameter portion 17b, not shown but as is well known, serves as a connection end to a circuit area of a mother board. The second wide-diameter portion 17b may have a hemispherical section, for example, when necessary.

A synthetic resin 21 is formed on the upper surface 14a of the dielectric substrate 14 to encapsulate the semiconductor chip 11, the bonding wires 15 and the conductive patterns 16.

The resin-encapsulated semiconductor package 10, having the second wide-diameter portion 17b at the other end of each conductor 17 to serve as a connection end to the mother board as described above, is electrically connected and mechanically secured to the mother board through each conductor 17.

The conductor 17 functions as an electrical and mechanical connector to the mother board. At the circumferential surface near the first wide-diameter portion 17a provided at one end of the conductor 17 and at the flange surface 20 of the wide-diameter portion 17a, in other words, at the side and upper surfaces of the conductive pattern 16, the conductor 17 is electrically and mechanically joined to the corresponding conductive pattern.

Therefore, the conductive pattern 16 can be securely connected to the corresponding conductor 17, so that improper contact due to insufficient strength can be prevented securely.

An example of a method for manufacturing the semiconductor package shown in FIG. 1 will be described with reference to FIGS. 2(a)–2(f).

Figure 2A:
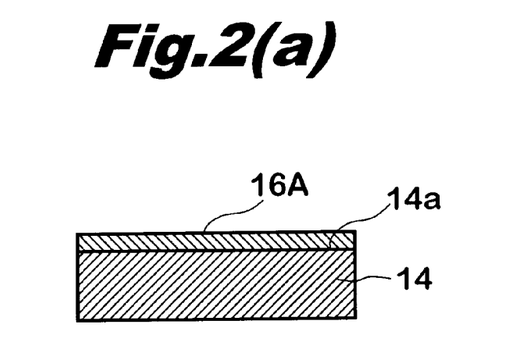

As shown in FIG. 2(a), a conductive layer 16A is formed on one surface 14a of the dielectric substrate 14. This conductive layer 16A can be formed by a layer of metal, such as copper.

Figure 2B:
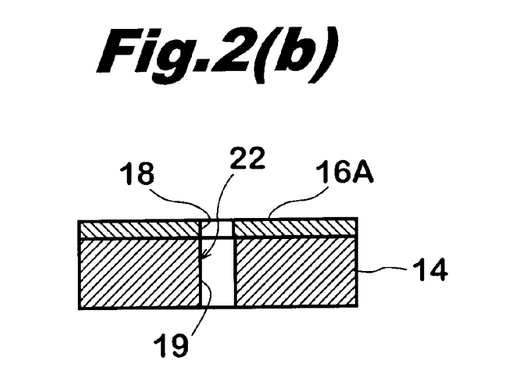

In a conductive layer 16A and the dielectric substrate 14, a hole 22 (18 and 19) is formed passing through the dielectric substrate 14 and the conductive layer 16A by well-known photolithography and etching technique, for example, as shown in FIG. 2(b).

After the through-hole 22 (18 and 19) has been formed, by using photolithographic and etching techniques mentioned above, unnecessary portions of the conductive layer 16A are removed to form the conductive patterns from the conductive layer 16A. The conductive layer 16A is patterned to form the conductive patterns 16 by the photolithography and etching technique.

Figure 2C:
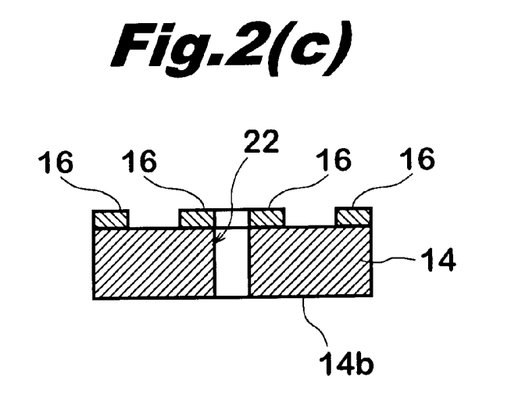

After the conductive pattern has been formed, the photoresist used in the photolithographic and etching techniques to form the conductive pattern is gone, so that the through-hole 22 (18 and 19) is left with both ends open as shown in FIG. 2(c). After the conductive layer 16A has been formed on the dielectric substrate 14, by forming the through-hole 22 and then forming the conductive pattern 16 by photolithographic and etching steps, stress applied to the conductive pattern during formation of the through-hole 22 can be alleviated.

Figure 2D:
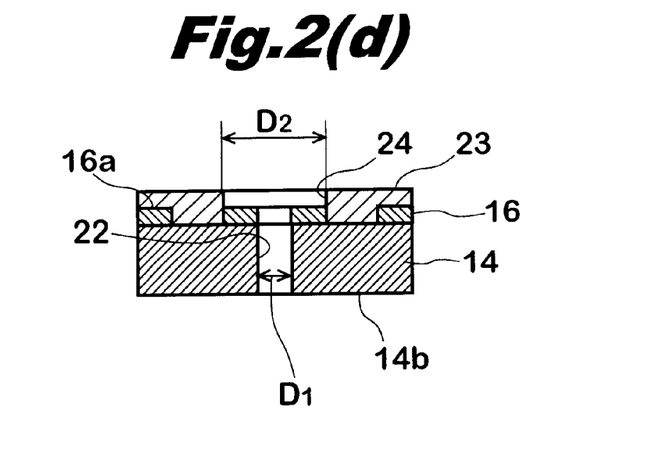

In the example of FIG. 2(d), after the conductive pattern 16 has been formed by patterning of the conductive layer 16A, an insulating protective film 23 made of a photoresist material, for example, is formed to protect the surface of the conductive pattern.

At that portion of the insulating protective film 23 which corresponds to the through-hole 22, a recess that exposes the opening edge portion over the upper surface 16a of the conductive pattern 16, in other words, an opening portion 24, is formed with a diameter D2 larger than the diameter D1 of the through-hole 22 (18 and 19).

Therefore, because the insulating protective film 23 keeps open one end of the through-hole 22 through the opening portion 24, the one end of the through-hole 22 (18 and 19) is never closed by the insulating protective film 23 and both ends are open.

Figure 2E:
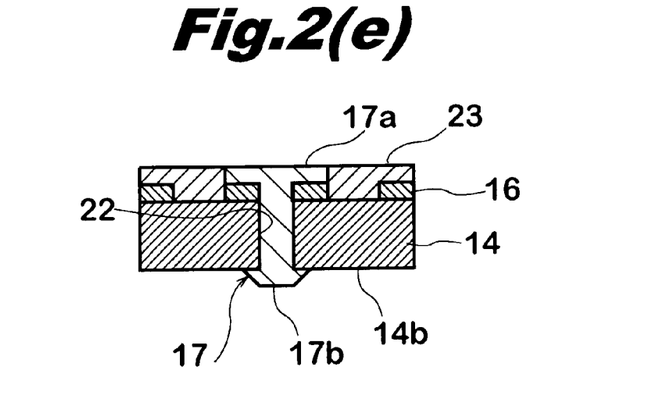

While both ends of the through-hole 22 (18 and 19) are open, as shown in FIG. 2(e), the through-hole 22 (18 and 19) is filled with a conductive material for the conductor 17, and at the same time, the space defined by the opening portion 24 is also filled with the conductive material. An end portion protruding beyond the lower surface 14b of the dielectric substrate 14 is formed monolithic with the conductor 17.

The portion that fills up the opening portion 24 forms the first wide-diameter portion 17a of the conductor 17, and the end portion protruding beyond the lower surface 14b of the dielectric substrate 14 forms the second wide-diameter portion 17b.

As a conductive material to fill up the through-hole 22 (18 and 19), copper or nickel, for example, may be used, and the through-hole 22 and the opening portion 24 may be filled with this conductive material by electrolytic plating or electroless plating.

Instead of the plating method mentioned above, a negative pressure method (in which a negative pressure is applied to one end of the through-hole to draw a molten filling material into the through-hole, and then the filling material is solidified by cooling, for example) may be used to form the conductor, including the first and second wide-diameter portions 17a and 17b.

Further, by having a molten metal drip from one end of the through-hole, the through-hole 22 (18 and 19), including the opening portion 24, can be filled with the conductive material. As the material solidifies, the conductor 17, including the first and the second wide-diameter portions 17a and 17b, can be formed.

The second wide-diameter portion 17b can be formed by a free surface of a conductive material not restricted by a metal mold, or alternatively, a metal mold, not shown, may be used to form the second wide-diameter portion 17b. When a metal mold is used, a leak hole is formed in the mold.

By a method other than those described above, the through-hole may be filled with a conductive material. In any case, because both ends of the through-hole 22 are open while the through-hole 22 is filled with a conductive material, when a conductive material is supplied from one open end, the other open end can be utilized as a leak hole.

Therefore, according to the method described above, a leak hole can be secured to discharge air bubbles to the outside, and the through-hole 22 (18 or 19) can be filled with the conductive material without causing bubbles to occur, and the wide-diameter portion 17a can be made in order to ensure electrical and mechanical connection of each conductive pattern with the corresponding conductor 17.

Figure 2F:
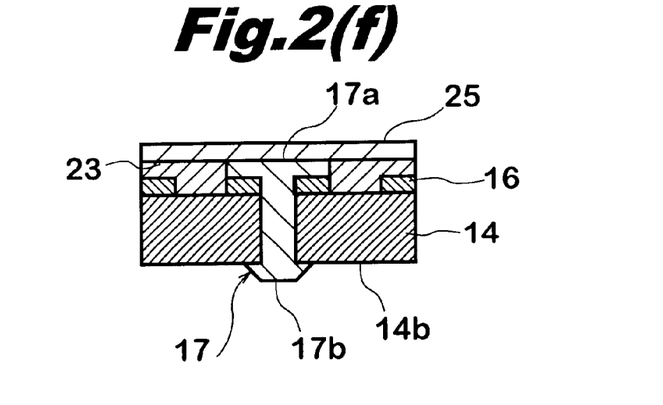

In the example of FIG. 2(f), after the conductor 17, including the first and second wide-diameter portions 17a and 17b, has been formed, an auxiliary protective film 25, like the protective film 23, can be applied to cover the first wide-diameter portion 17a of each conductor 17. The semiconductor chip 11 is secured to the protective film 25 with interposition of a binding layer 13 like the one shown in FIG. 1, and the connection terminals 12 are connected to the corresponding conductive patterns 16 through the bonding wires. After this, as described above, those items are encapsulated by a synthetic resin 21, by which the semiconductor package 10 is completed.

According to the above-mentioned method of the present invention, at one end of the conductor 17 that fills up the through-hole 22 (18 and 19), the first wide-diameter portion 17a can be formed relatively easily, which is electrically and mechanically connected firmly to a conductive pattern 16 corresponding to the conductor 17, so that a semiconductor package, which has the conductive patterns 16 and the corresponding conductors 17 securely jointed together, can be formed relatively easily.

Further, according to the above-mentioned method of the present invention, when the through-hole 22 is filled with a conductive material, both ends of the through-hole 22 are in the open state. Because of this, when a conductive material is supplied from one open end, the other open end can be utilized as a leak hole. In other words, a leak hole can be secured, and so the through-hole 22 (18 and 19) can be filled with conductive material without giving rise to trapped air bubbles, and as a result it is possible to reliably prevent an increase in electrical resistance and poor connection caused by air bubbles in the conductor 17.

Embodiment 2

Figure 3:
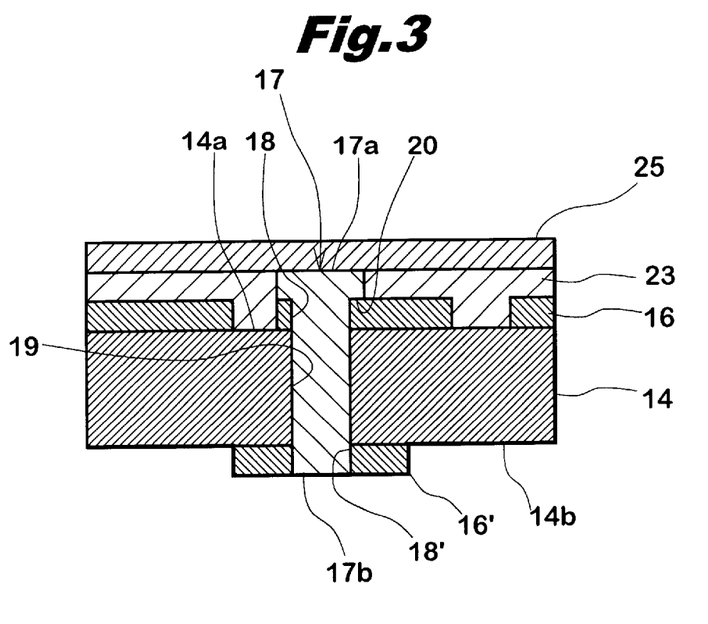
FIG. 3 is a sectional view partially showing a second embodiment of the present invention.

In the semiconductor package 10 in the second embodiment shown in FIG. 3, a lower conductive pattern 16' is formed on the lower surface 14b of the dielectric substrate 14. The other end of the conductor 17 passes in the thickness direction of the lower conductive pattern 16' through the hole 18' formed from the lower surface 14b of the dielectric substrate to the lower conductive pattern 16', and is, at the circumferential surface of the other end of the conductor 17, electrically and mechanically connected to the lower conductive pattern 16'.

In the type having the conductive patterns 16 and 16' respectively on the upper surface 14a and on the lower surface 14b of the dielectric substrate 14, the semiconductor package 10 is connected, at a specified location of the lower conductive pattern 16', to the mother board.

The conductive pattern 16' can be formed simultaneously with patterning of the upper conductive pattern and, because of this, when the through-hole 22 (18 and 19) is filled with a conductive material, one open end can be used as a leak hole. Therefore, when the conductor 17 is formed (the conductor 17 having one end 17a, the first wide-diameter portion, connected to the upper conductive pattern 16 and the other end 17b protruding beyond the lower surface 14b of the dielectric substrate 14 connected to the lower conductive pattern 16'), voids are securely prevented from occurring in the conductor.

In the semiconductor package 10 shown in FIG. 3, in each conductor 17, as in the example in FIG. 1, one end, the first wide-diameter portion 17a is, at the circumferential surface of the corresponding upper conductive pattern 16, which defines the hole 18, with the upper conductive pattern, electrically and mechanically connected with the conductive pattern, and furthermore the flat flange surface of the wide-diameter portion 17a is electrically and mechanically connected with the upper conductive pattern 16. Therefore, the conductor is, also at the opening edge portion of the hole 18 of that upper surface 16a of the conductive pattern 16 which is connected to the flat flange surface 20, electrically and mechanically connected to the conductive pattern 16.

Embodiment 3

Figure 4:
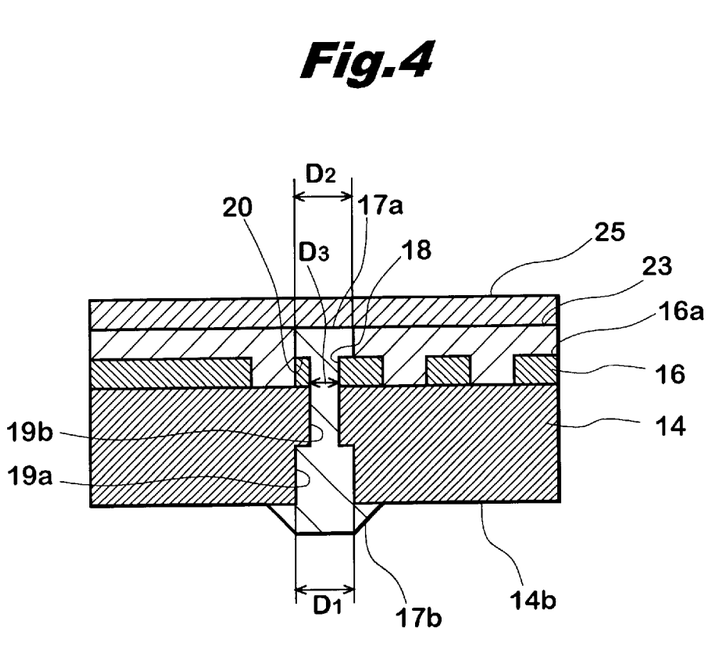
FIG. 4 is a sectional view partially showing a third embodiment of the present invention.

In the semiconductor package 10 shown in FIG. 4, the through-hole 19 of the dielectric substrate 14 has a lower-half portion 19a, which has a bore diameter D1 and which is open to the lower surface 14b of the dielectric substrate 14, and an upper-half portion 19b, which has a bore diameter D3 smaller than the bore diameter D1 of the lower-half portion and which is open to the upper surface 14a of the dielectric substrate 14. The hole 18 of the conductive pattern 16 has a bore diameter D3 equal to the small bore diameter D3.

The conductor 17 to fill up the through-hole 22 (18 and 19) has diameters corresponding to the respective holes, and at the end of the small-diameter portion that passes through the hole of the conductive pattern 16, a wide-diameter portion 17a is formed, which is the same as what has been mentioned above.

This wide-diameter portion 17a is, at a flat flange surface 20 the same as what has been described, in contact with the opening edge portion of the upper surface 16a of the conductive pattern 16, so that the bore diameter D3 of the hole 19 of the conductive pattern 16 can be reduced without decreasing the contact area between the conductor 17 and the conductive pattern 16 to a smaller area than previously.

It is advantageous to reduce the bore diameter D3 of that hole 18 for the conductor 17 which is formed in the conductive pattern because greater freedom is achieved in pattern design for the conductive pattern 16 formed on the dielectric substrate 14.

Embodiment 4

Figure 5:
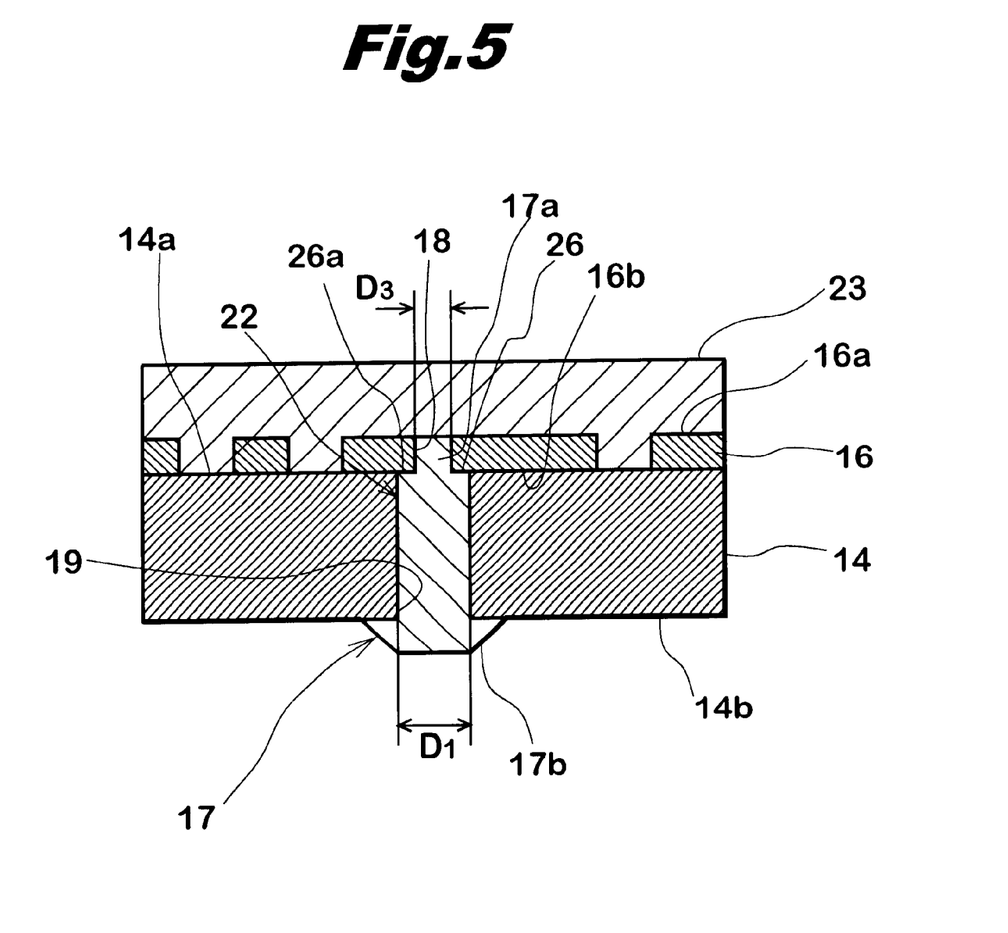
FIG. 5 is a sectional view partially showing a fourth embodiment of the present invention.

As a method for effectively reducing the bore diameter D3 of that hole 18 for the conductor which is formed in the conductive pattern 16, it is possible to give the hole 19 in the dielectric substrate 14 a constant bore diameter D1 in its extending direction and make the bore diameter D1 larger than the bore diameter D3 of the hole 18 in the conductive pattern 16 as shown in FIG. 5.

Owing to a difference in bore diameter (D1–D3) between the holes 19 and 18 of the through-hole 22, the conductor 17 to fill up the through-hole 22 has a shoulder portion 26 defined between the main body (17) corresponding to the large-diameter hole 19 and the small-diameter portion 17a corresponding to the small-diameter hole 18.

The circumferential surface of the small-diameter portion 17a, which is defined by the shoulder portion 26 of the conductor 17, is in contact with and is joined to the circumferential surface of the hole 18 of the conductive pattern 16, which accommodates the small-diameter portion. The flat surface 26a defined by the shoulder portion 26 is in contact with and is joined to the opening edge portion of the hole 18 at the lower surface 16b of the conductive pattern 16.

In the forth embodiment shown in FIG. 5, by forming the end portion 17a as a small-diameter portion to thereby increase the contact area between the flat surface 26a of the shoulder portion 26, which defines the small-diameter portion, and the conductive pattern 16, the contact area between the conductor 17 and the conductive pattern 16 can be increased.

Therefore, according to the embodiment shown in FIG. 5, the bore diameter of the hole formed in the conductive pattern 16 can be decreased for the conductor 17, the contact area between the conductor 17 and the conductive pattern 16 can be prevented from decreasing and can be increased, and the end portion of the conductor 17 can be prevented from protruding as a wide-diameter portion on the conductive pattern 16. This is very advantageous in increasing the degree of freedom of design of the conductive pattern 16.

Description has been made of an example in which the semiconductor chip is connected through bonding wires to the conductive patterns on the dielectric substrate 14. For electrical connection of those parts, various types of electrical connection structure without bonding wires, such as a flip chip bonding type, may be used at one's discretion. In the embodiments of the present invention, description has been made referring to the conductive patterns having holes at locations corresponding to the through-holes provided in the dielectric substrate. However, the conductive pattern need not necessarily have holes corresponding to the through-holes but each through-hole is only required to have both ends open when it is filled with a conductive material. Further, the holes in the dielectric substrate and the conductive patterns are not limited to circular holes but may be changed to other shapes as one thinks suitable.

According to semiconductor packages of the present invention, as has been described, the conductor passing through the dielectric substrate, on which a semiconductor chip is mounted, is, at the circumferential surface of the conductive pattern on the dielectric substrate, which defines the hole, and also at the opening edge portion of the through-hole on the conductive pattern, connected to the conductive pattern, so that the conductor and the conductive pattern can be electrically connected securely, making it possible to improve the reliability of semiconductor packages.

According to a method for manufacturing a semiconductor package in the present invention, after the conductive patterns are formed, the conductors are formed as described above. Therefore, a conductive material can be supplied to fill up the through-holes while both ends of the through-holes are open. Consequently, one of the two open ends can be used as a leak hole, for which reason the through-holes can be filled with conductors without voids, so that an increase in electrical resistance and faulty contact caused by presence of voids and that a semiconductor package excellent in reliability can be produced relatively easily.

What is claimed is:

1. A surface mount type semiconductor, comprising:
   a semiconductor chip having a connection terminal;
   a dielectric substrate with the semiconductor chip mounted on a top surface thereof, said top surface of said dielectric substrate being provided with a conductive pattern that is connected to said connection terminal of said semiconductor chip, said dielectric substrate also having a through-hole passing through it from said top surface to a bottom surface of said dielectric substrate; and
   a conductor extending through said through-hole and filling up said through-hole, with a top end of said conductor being connected to said conductive pattern and a bottom end of said conductor serving as a connection end to a mother board disposed under said bottom surface of said dielectric substrate, said semiconductor chip and said conductive pattern being encapsulated by a resin on said dielectric substrate,
   wherein said conductive pattern has a hole with an inner surface,
   wherein said top end of said conductor has a portion that extends through said hole in said conductive pattern and is electrically connected to said inner surface thereof,
   wherein said top end of said conductor has another portion that overlaps an annular region of a top side of said conductive pattern around said hole in said conductive pattern, providing a flange that is electrically connected to said top side of said conductor pattern, and
   wherein said hole in said conductive pattern has a smaller diameter than at least a portion of said through-hole in said dielectric substrate.

2. A surface mount type semiconductor, comprising:
   dielectric substrate having an upper surface and a lower surface, the substrate additionally having a first hole passing from the upper surface to the lower surface of the substrate, the first hole having an upper end and a predetermined diameter at its upper end;
   a conductive pattern on the upper surface of the substrate, the conductive pattern having a second hole that communicates with the first hole, the second hole having a diameter that is smaller than the diameter of the first hole at its upper end;
   a semiconductor chip mounted on the upper surface of the substrate and electrically connected to the conductive pattern; and
   a conductor made of a conductive material extending through the first and second holes, the conductor contacting the conductive pattern at an inner surface of the second hole and also at an annular region of a lower surface of the conductive pattern around the second hole.

3. A surface mount type semiconductor according to claim 2, wherein an external terminal is provided at a lower end of the conductor for connection to an external device.

4. A surface mount type semiconductor according to claim 3, wherein the external device is a mother board.

5. A surface mount type semiconductor according to claim 2, further comprising:
   a sealing element encapsulating the semiconductor chip and the conductive pattern.

6. A surface mount type semiconductor according to claim 5, wherein the sealing element is made of a resin.

7. A surface mount type semiconductor, comprising:

a dielectric substrate having an upper surface and a lower surface, the substrate additionally having a first hole passing from the upper surface of the substrate to the lower surface of the substrate, the first hole having a lower portion with a predetermined diameter and an upper portion with a diameter that is smaller than the diameter of the lower portion;

a conductive pattern formed on the upper surface of the substrate, the conductive pattern having a second hole that communicates with the first hole, the second hole having a diameter that is substantially the same as the diameter of the upper portion of the first hole;

a semiconductor chip mounted on the upper surface of the substrate and electrically connected to the conductive pattern; and a conductor made of a conductive material extending through the first and second holes, wherein the conductor has an upper portion that overlaps an annular region of a top side of the conductive pattern around the second hole, providing a flange that is electrically connected to the top side of the conductive pattern, and the conductor also has a lower portion that provides an external connection terminal at the other end.

8. A surface mount type semiconductor according to claim 7, wherein the external terminal is connected to an external device.

9. A surface mount type semiconductor according to claim 8, wherein the external device is a mother board.

10. A surface mount type semiconductor according to claim 7, further comprising:

a sealing element encapsulating the semiconductor chip and the conductive pattern.

11. A surface mount type semiconductor according to claim 10, wherein the sealing element is made of a resin.

* * * * *